(12) United States Patent
Kim (10) Patent No.: US 7,880,852 B2
(45) Date of Patent: Feb. 1, 2011

(54) THIN FILM TRANSISTOR AND LIQUID CRYSTAL DISPLAY HAVING THE SAME

(75) Inventor: Dong-Gyu Kim, Yongin-si (KR)

(73) Assignee: Samsung Electronics Co., Ltd., Suwon-Si (KR)

( * ) Notice: Subject to any disclaimer, the term of this patent is extended or adjusted under 35 U.S.C. 154(b) by 199 days.

(21) Appl. No.: 12/181,191

(22) Filed: Jul. 28, 2008

(65) Prior Publication Data
US 2009/0040407 A1 Feb. 12, 2009

(30) Foreign Application Priority Data
Aug. 8, 2007 (KR) ............. 10-2007-0079405

(51) Int. Cl.
*G02F 1/1343* (2006.01)
(52) U.S. Cl. .............. 349/145; 349/146; 257/59
(58) Field of Classification Search .......... 349/145, 349/146; 257/59, 72
See application file for complete search history.

(56) References Cited

U.S. PATENT DOCUMENTS

| 2001/0001567 A1* | 5/2001 | Lyu et al. ............. 349/143 |
| 2003/0043326 A1* | 3/2003 | Sawasaki et al. ......... 349/123 |
| 2005/0134779 A1* | 6/2005 | Park et al. ............. 349/139 |
| 2006/0092341 A1* | 5/2006 | Huang et al. ........... 349/38 |

* cited by examiner

*Primary Examiner*—Akm E Ullah
(74) *Attorney, Agent, or Firm*—F. Chau & Associates, LLC (57) ABSTRACT

A thin film transistor (TFT) substrate includes: a plurality of gate lines extending in one direction, a plurality of data lines extending in a direction intersecting the gate lines, a pixel electrode formed in a pixel region defined by an intersection of the gate line and the data line, and with one side of the pixel electrode overlapping a portion of one data line and another side of the pixel electrode overlapping a portion of another data line. The TFT further includes a storage electrode line having a storage electrode disposed in a central portion of the pixel region.

15 Claims, 10 Drawing Sheets

THIN FILM TRANSISTOR AND LIQUID CRYSTAL DISPLAY HAVING THE SAME

CROSS-REFERENCE TO RELATED APPLICATION

This application claims priority to Korean Patent Application No. 10-2007-0079405 filed on Aug. 8, 2007, the disclosure of which is hereby incorporated by reference in its entirety.

BACKGROUND OF THE INVENTION

1. Technical Field

The present disclosure relates to a thin film transistor substrate and a liquid crystal display having the same.

2. Description of the Related Art

Liquid crystal displays ("LCD"s) typically include lower and upper substrates having field-generating electrodes, e.g., a pixel electrode and a common electrode, respectively, and a liquid crystal layer interposed between the lower and upper substrates. LCDs display an image in such a way that orientations of liquid crystal molecules in the liquid crystal layer are determined by applying a voltage to the field generating electrodes to generate an electric field across the liquid crystal layer and polarization of incident light is controlled.

Among the various kinds of LCDs, a vertical alignment ("VA") mode LCD, in which major axes of liquid crystal molecules are aligned vertically to the upper and lower substrates while an electric field is not applied, is currently the focus of much attention due to the high contrast ratio and easy implementation of a wide viewing angle. To ensure the wide viewing angle in the VA mode LCD, a method of forming a cutout or a protrusion in/on a field-generating electrode is used. The cutout and the protrusion can control the orientation direction of the liquid crystal molecules. Accordingly, the tilting angles of the liquid crystal molecules can be distributed in various directions using the cutout and the protrusion to ensure a wide viewing angle To more improve a wide viewing angle of the VA mode LCD, a patterned vertical alignment ("PVA") mode LCD and a multi-domain vertical alignment ("MVA") mode LCD have been proposed. In the PVA mode LCD, a common electrode is patterned to align liquid crystal molecules in different directions due to the patterned common electrode, thereby noticeably improving the viewing angle. In the MVA mode LCD, a protrusion formed on an orientation film distorts the direction of magnetic field to align liquid crystal molecules in different directions, thereby improving the viewing angle significantly.

In addition, another LCD has recently been introduced, in which microslits are formed in a pixel electrode to divide a liquid crystal layer into four domains. Specifically, in this LCD, a storage electrode line is formed to cross the center of a pixel region defined by a gate line and a data line, and a plurality of microslits are formed in the pixel electrode from horizontal and vertical parts. The horizontal and vertical parts respectively divide the pixel region into halves vertically and horizontally, resulting in four sub pixel regions. Herein, the storage electrode line and the horizontal part overlap each other, and a thin film transistor ("TFT") is formed to be closer to one side of the pixel region. The data line and the pixel electrode are insulated from each other by a thin inorganic insulation layer.

The above-described LCD has a low aperture ratio because the pixel electrode does not overlap the data line. Thus, to obtain a high aperture ratio, the pixel electrode should overlap the data line. To this end, a thick low-dielectric-constant insulation layer such as an organic layer should be formed on the data line. However, this may lead to a decrease in storage capacitance due to the thick low-dielectric-constant insulation layer provided between the storage electrode line and the pixel electrode even though the storage electrode line and the vertical part overlap each other.

Further, it may be difficult to drive the above-described LCD at a frame refresh rate of 120 Hz using a dot inversion driving method. The driving method of the LCD at a frame refresh rate of 120 Hz is a very effective method of minimizing LCD motion blur, and thus it is being rapidly standardized. However, if the frame refresh rate increases from 60 Hz to 120 Hz, a turn-on time of each gate line may decrease to half or less compared to 60 Hz. Therefore, the dot inversion driving method may not be available for high-resolution LCDs such as Full-HD (high definition) LCDs. Moreover, it may also be necessary to form a low-resistance interconnection, for example, a copper interconnection having the specific resistance of 2.5 $\mu\Omega$cm or smaller. However, it may be very difficult to form a low-resistance interconnection, as the LCD becomes greater and requires higher resolution than ever before.

Moreover, when the LCD is driven in dot inversion driving manner, a data line voltage may swing to a maximum of 15 V or higher at every one horizontal time, thereby possibly increasing the temperature of a source driver IC. A vertical inversion driving method is a possible way to avoid a high resistance and the increase in the temperature of the source driver IC. In the vertical inversion driving method, a capacitance variation between the data line and the pixel electrode may become very sensitive depending on an overlay offset between the data line and the pixel electrode in comparison with the dot inversion driving method. Consequently, as a result, this may produce vertical crosstalk, which in turn may lead to display defects.

Moreover, as the TFT is disposed closer to one side of the pixel region in the LCD, the aperture ratio of a pixel in an odd-numbered row may be different from that of a pixel in an even-numbered row. Therefore, two horizontal lines are displayed due to the difference in aperture ratio.

SUMMARY OF THE INVENTION

Exemplary embodiments of the present invention provide a TFT substrate and an LCD having the same which may improve an aperture ratio by overlapping a pixel electrode and a data line.

Exemplary embodiments of the present invention provide a TFT substrate and an LCD having the same, which may have a sufficient storage capacitance while improving an aperture ratio.

Exemplary embodiments of the present invention also provide a TFT substrate and an LCD having the same which may prevent vertical crosstalk. The TFT substrate may be driven in a dot inversion manner even though a data signal is applied in a vertical inversion manner to prevent vertical crosstalk.

Exemplary embodiments of the present invention may provide a TFT substrate and an LCD having the same which may prevent two horizontal lines from being displayed by forming a TFT in a central portion of one side of a pixel region to equalize an aperture ratio in every row.

In accordance with an exemplary embodiment, a TFT substrate is provided. The TFT substrate includes: a plurality of gate lines extending in one direction, a plurality of data lines extending in a direction intersecting the gate lines, a pixel electrode formed in a pixel region defined by an intersection of the gate line and the data line, and with one side of the pixel electrode overlapping a portion of one data line and another side of the pixel electrode overlapping a portion of another data line. The TFT further includes a storage electrode line having a storage electrode disposed in a central portion of the pixel region.

In accordance with another exemplary embodiment, a TFT substrate is provided. The TFT substrate includes: a plurality of first gate lines and a plurality of second gate lines extending in one direction, and spaced apart from each other, a plurality of data lines extending in another direction intersecting the first and second gate lines, a first pixel electrode and a second pixel electrode provided in a pixel region including a first subpixel region and a second sub pixel region defined by intersections of the first gate lines and the second gate lines with the data line, a predetermined region at one side of the pixel electrode partially overlapping one data line and a predetermined region at another side of the pixel electrode partially overlapping another data line. The TFT substrate further includes a first storage electrode line and a second storage electrode line spaced apart from each other, and having a first storage electrode and a second storage electrode in central portions of the first sub pixel region and the second sub pixel region.

In accordance with yet another exemplary embodiment, an LCD is provided. The LCD includes: a first substrate including pixel electrodes formed to partially overlap data lines in pixel regions defined by intersections of a plurality of gate lines and a plurality of data lines, and a storage electrode line having a storage electrode disposed in a central portion of the pixel region; a second substrate including a common electrode, and facing the first substrate and a liquid crystal layer disposed between the first substrate and the second substrate.

In accordance with still another exemplary embodiment, an LCD is provided. The LCD includes: a first substrate including a first pixel electrode and a second pixel electrode formed to partially overlap the data lines in pixel regions including a first sub pixel region and a second sub pixel region defined by a plurality of first gate lines and a plurality of second gate lines and a plurality of data lines intersecting the plurality of first gate lines and the plurality of second gate lines, and a first storage electrode line and a second storage electrode line having a first storage electrode and a second storage electrode disposed in central portions of the first sub pixel region and the second sub pixel regions. The LCD further includes a second substrate which includes a common electrode, and faces the first substrate; and a liquid crystal layer disposed between the first substrate and the second substrate.

BRIEF DESCRIPTION OF THE DRAWINGS

Exemplary embodiments can be understood in more detail from the following description taken in conjunction with the accompanying drawings, in which.

DETAILED DESCRIPTION OF THE EXEMPLARY EMBODIMENTS OF THE INVENTION

Hereinafter, specific embodiments will be described in detail with reference to the accompanying drawings. The present invention may, however, be embodied in different forms and should not be construed as being limited to the exemplary embodiments set forth herein. In the figures, the dimensions of layers and regions are exaggerated for clarity of illustration, and like reference numerals refer to like elements throughout. It will also be understood that when a layer (or film) is referred to as being 'on' another layer or substrate, it can be directly on the other layer or substrate, or intervening layers may also be present. Further, it will be understood that when a layer is referred to as being 'under' another layer, it can be directly under, and one or more intervening layers may also be present. In addition, it will also be understood that when a layer is referred to as being 'between' two layers, it can be the only layer between the two layers, or one or more intervening layers may also be present.

Figure 1:
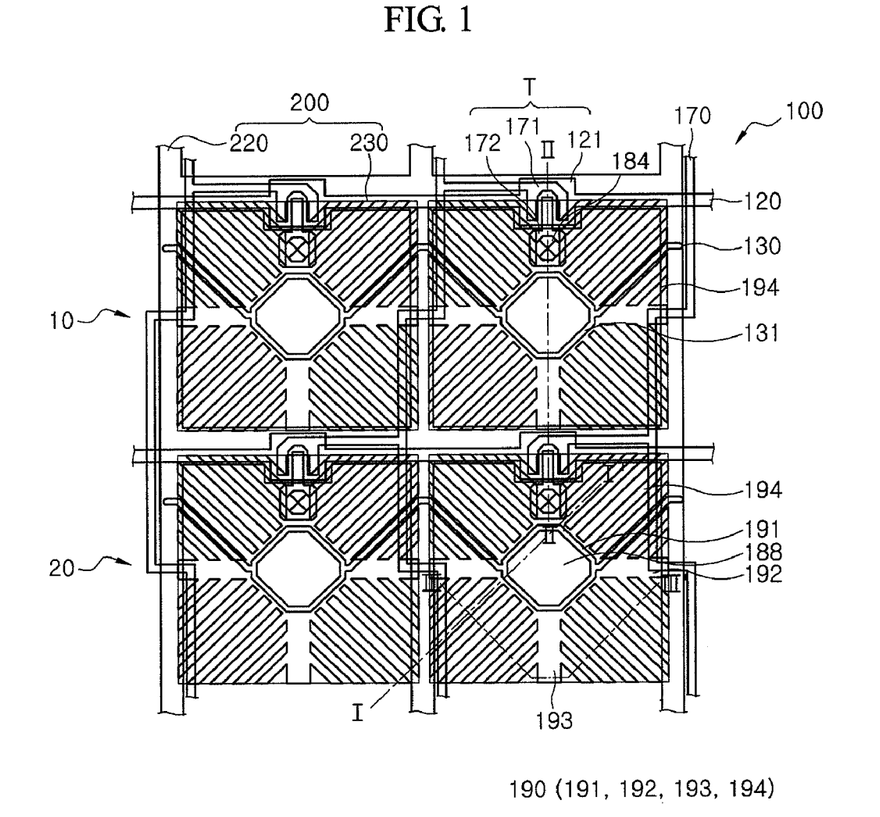
FIG. 1 is a plan view of a liquid crystal display (LCD) panel in accordance with an exemplary embodiment.
Figure 2:
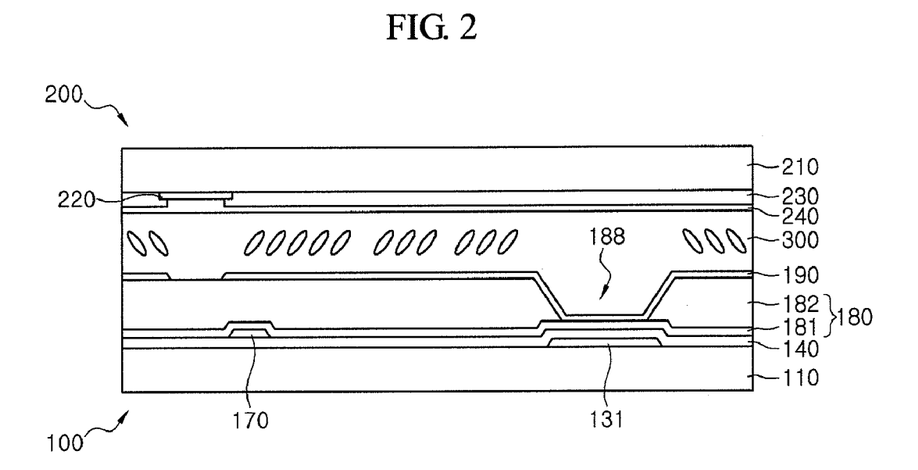
FIG. 2 is a sectional view taken along line I-I' of FIG. 1.
Figure 3:
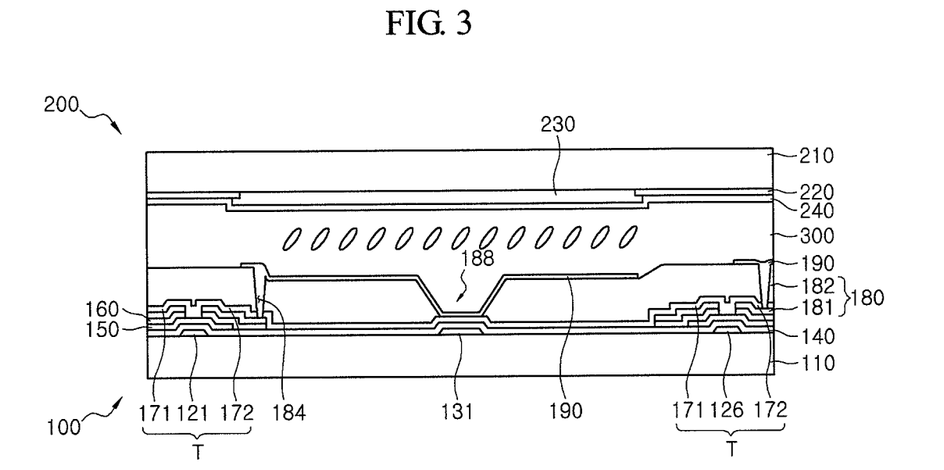
FIG. 3 is a sectional view taken along line II-II' of FIG. 1.
Figure 4:
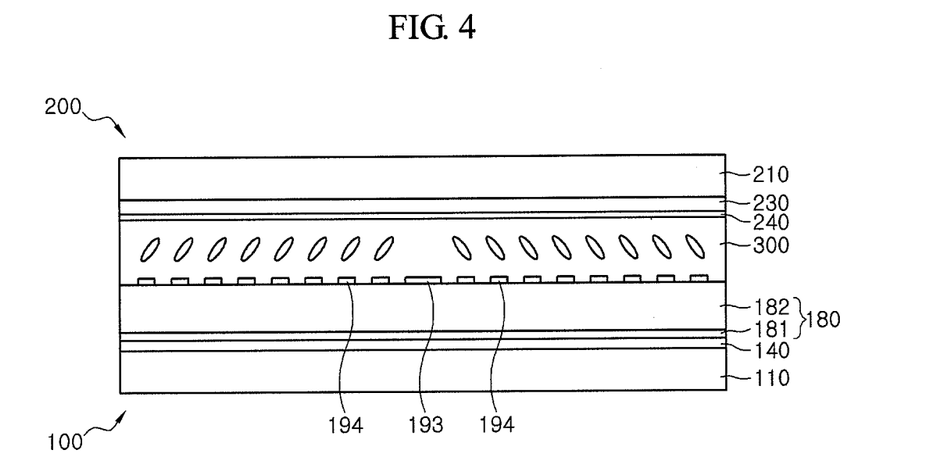
FIG. 4 is a sectional view taken along line III-III' of FIG. 1.

FIG. 1 is a plan view of an LCD panel in accordance with an exemplary embodiment. FIG. 2 is a sectional view taken along line I-I' of FIG. 1, FIG. 3 is a sectional view taken along line II-II' of FIG. 1, and FIG. 4 is a sectional view taken along line III-III' of FIG. 1.

Referring to FIGS. 1 through 4, the LCD panel in accordance with the exemplary embodiment includes a lower substrate 100 provided with a gate line 120, a data line 170 and a TFT, an upper substrate 200 provided with a common electrode 240, a liquid crystal layer 300 interposed between the lower and upper substrates 100 and 200.

Referring to FIG. 1, the lower substrate 100 includes a plurality of gate lines 120 extending in one direction over a first insulating substrate 110, a plurality of data lines 170 crossing the gate lines 120, pixel electrodes 190, and TFTs T. The pixel electrode 190 is disposed in a pixel region defined by the gate line 120 and the data line 170, and has a plurality of microslit patterns. The TFT T is connected to the gate line 120, the data line 170 and the pixel electrode 190, and is disposed in a central portion of the gate line 120 located at one side of the pixel region.

The gate line 120 extends in one direction, e.g., a horizontal direction, over the first insulating substrate 110. A portion of the gate line 120 protrudes to have a greater width than the other portions thereof to thereby form a gate electrode 121. The gate electrode 121 is disposed in the central portion of the gate line 120 between two adjacent data lines 170.

A storage electrode line 130 and the gate line are provided on the same layer. The storage electrode line 130 has a curved shape and passes through a region between the gate lines 120 of the pixel region. A portion of the storage electrode line 130 protrudes to have a greater width than the other portions thereof, and thereby a storage electrode 131 is formed. For example, the storage electrode line 130 includes a portion that extends downwardly at a predetermined slope from one side of the pixel region and another portion that extends upwardly at a predetermined slope. Hereinafter, for convenience in description, the former and the latter will be referred to as a downwardly extending portion and an upwardly extending portion, respectively. The storage electrode line 130 may further include a portion that extends horizontally (hereinafter, referred to as a horizontally extending portion for simplicity) between the downwardly extending portion and the upwardly extending portion. In detail, the downwardly extending portion downwardly extends toward a central portion of the pixel region from an upper portion of one side of the pixel region. For instance, the downwardly extending portion may downwardly extend toward the central portion of the pixel region from a predetermined region between a starting point of a horizontal line, which horizontally divides the pixel region into halves, and the gate line 120 disposed above the horizontal line. For example, the predetermined region from which the downwardly extending portion extends may be a central region between the starting point of horizontal line and the gate line 120. The horizontally extending portion has a predetermined length, and extends from an end of the downwardly extending portion to pass through the central portion of the pixel region. The storage electrode 131 is disposed at the horizontally extending portion. The upwardly extending portion extends from an end of the horizontally extending portion to an upper portion of the right side of the pixel region at a predetermined slope. For instance, the upwardly extending portion may upwardly extend to a predetermined region between an end point of the horizontal line, which horizontally divides the pixel region into halves, and the gate line 120 disposed above the horizontal line. For example, the predetermined region to which the upwardly extending portion extends may be a central region between the end point of the horizontal line and the gate line 120. Absolute values of slopes of the downwardly extending portion and the upwardly extending portion are substantially identical. The starting point of the downwardly extending portion and the end point of the upwardly extending portion face each other. A slope of the storage electrode line 130 may be substantially equal to that of an oblique part 194 of the pixel electrode 190, which will be described later. The storage electrode line 130 may be designed to overlap microslits of the oblique part 194, so that an aperture ratio is not reduced. The storage electrode lines 130 are horizontally connected to each other across one pixel region and another pixel region adjacent thereto. The storage electrode 131 with a predetermined width is disposed in the central portion of the pixel region, and may have various shapes such as, for example, a circle, an ellipse, a diamond, a square, an octagon and the like. An edge of the storage electrode 131 may be perpendicular to the oblique part 194. The storage electrode 131 overlaps the pixel electrode 190 to form a storage capacitor.

Herein, the gate line 120 and the storage electrode line 130 may be formed on the same layer through the same process. The gate line 120 and the storage electrode line 130 may be formed of, for example, one of aluminum (Al), copper (Cu), neodymium (Nd), silver (Ag), chromium (Cr), titanium (Ti), tantalum (Ta), molybdenum (Mo) and combinations thereof, or an alloy including at least one of the foregoing materials. Further, the gate line 120 and the storage electrode line 130 may have a monolayered structure or a multilayered structure having a plurality of metal layers. The multilayered structure may include layers having different physical properties. For example, the multilayer structure may include a layer formed of material with low specific resistance, and another layer formed of material with beneficial contact properties. The layer formed of material with low specific resistance may include, for example, aluminum (Al)-based, silver (Ag)-based or copper (Cu)-based metal so as to reduce a signal delay and a voltage drop. The layer formed of the material with beneficial contact properties may include a material having beneficial contact properties when contacting indium tin oxide (ITO) and indium zinc oxide (IZO), such as for example, one of chromium (Cr), molybdenum (Mo), molybdenum alloy, tantalum (Ta), titanium (Ti) and combinations thereof.

As illustrated in FIGS. 1 through 4, a gate insulation layer 140 is disposed on the entire surface covering the gate line 120 and the storage electrode line 130. The gate insulation layer 140 may have, for example, a monolayered structure or a multilayered structure formed of silicon oxide ($SiO_2$) or silicon nitride ($SiN_x$).

An active layer 150 formed of a first conductive material such as, for example, amorphous silicon is disposed on the gate insulation layer 140 provided over the gate electrode 121. An ohmic contact layer 160 is disposed on the active layer 150. Here, the ohmic contact layer 160 is formed of a second conductive material such as, for example, n+ hydrogenated amorphous silicon where n-type impurities are heavily doped.

Referring back to FIG. 1, the data line 170 extends in a direction intersecting the gate line 120, for example, in a vertical direction, and may have protruding patterns which are periodically arranged. For instance, the data line 170 is configured so that right protruding portions and left protruding portions are alternately arranged with respect to a vertical boundary of two pixel regions which are adjacent to each other. For example, for a pixel region 20, the data line 170 protrudes to the right from a central region of the pixel region 20 to a central region of a next pixel region which is downwardly adjacent to the pixel region 20, and protrudes to the left from the central region of the pixel region 20 to a central region of another next pixel region which is upwardly adjacent to the pixel region 20. In this way, two data lines 170 are disposed along left and right sides of the pixel regions as shown in FIG. 1. The right data line overlaps a lower portion of a predetermined pixel region and an upper portion of another pixel region which is downwardly adjacent to the predetermined pixel region. The left data line overlaps an upper portion of the predetermined pixel region and a lower portion of another pixel region. Therefore, overlapping portions of each pixel region with the data line 170 are diagonally arranged with respect to the center of each pixel region. In this way, an aperture ratio can be improved because the data line 170 and the pixel region overlap each other. As each pixel region partially overlaps with two adjacent data lines 170, a voltage drop caused by capacitances of the pixel electrode 190 and one data line 170 to which a data signal is applied offsets a voltage rise caused by capacitances of the pixel electrode 190 and another data line 170 during frame operation. Thereby, a pixel voltage variation can be minimized. The data line 170 is branched into a source electrode extending up to the gate electrode 121 and a drain electrode 172 separated from the source electrode 171. The source electrode 171 may be branched from different data line 170 depending on a position of the pixel region. For example, the source electrode 171 of the pixel region 10 of an odd-numbered row may be branched from the left data line, whereas the source electrode 171 of the pixel region 20 of an even-numbered row may be branched from the right data line. Alternatively, the source electrode 171 of the pixel region 20 of the even-numbered row may be branched from the left data line, and the source electrode 171 of the pixel region 10 of the odd-numbered row may be branched from the right data line. As such, the LCD panel is driven in a dot inversion manner even though a data signal is applied in a vertical inversion manner.

The TFT T includes the gate electrode 121, the source electrode 171 and the drain electrode 172. A channel of the TFT T is formed between the source electrode 171 and the drain electrode 172. The TFT T is positioned in a central region of one side of the pixel region because the gate electrode 121 is disposed in a central region of the gate line 120 at one side of one pixel region. In this way, the TFTs T are disposed at equivalent positions in the respective pixel regions. Therefore, aperture ratios of pixels in each row and column can be maintained substantially the same, and thereby two horizontal lines caused by a difference in aperture ratio can be prevented.

The data line 170, the source electrode 171, and the drain electrode 172 may be formed of a conductive material used for the gate line 120.

A passivation layer 180 is disposed on the data line 170 and the drain electrode 172. The passivation layer 180 may include, for example, an organic material having beneficial planarization characteristics and photosensitivity, a low-dielectric-constant insulating material formed by plasma enhanced chemical vapor deposition (PECVD), or an inorganic material such as silicon nitride. The passivation layer 180 may include, for example, a thin first insulation layer 181 formed of silicon nitride, silicon oxide or the like, and a thick second insulation layer 182 formed of an inorganic material. Alternatively, a color filter may be provided instead of the second insulation layer 182, so that an LCD panel of a COA structure or an SCOA structure can be implemented.

As illustrated in FIGS. 2 and 3, a contact hole 184 and an opening 188 are provided in the passivation layer 180. The contact hole 184 exposes a predetermined region of the drain electrode 172, and the opening 188 exposes a region over the storage electrode 131. The contact hole 184 is formed by partially removing the first and second insulation layers 181 and 182, and the opening 188 is formed by keeping the first insulation layer 181 and then removing the second insulation layer 182.

A pixel electrode 190 formed of ITO or IZO is disposed on the passivation layer 180. The pixel electrode 190 is connected to the drain electrode 172 through the contact hole 184. The pixel electrode 190 overlaps the storage electrode 131 with the gate insulation layer 140 and the first insulation layer 181 interposed therebetween to form a storage capacitor. As, the first insulation layer 181 has a small thickness, sufficient storage capacitance can be ensured. Further, the storage capacitance can be controlled by, for example, adjusting an overlapping area between the storage electrode 131 and the pixel electrode 190.

As illustrated in FIG. 1, the pixel electrode 190 includes a central part 191, a horizontal part 192, a vertical part 193 and a plurality of oblique parts 194. The central part 191 is provided in the central region of the pixel region, and overlaps the storage electrode 131. The central part 191 may have the same shape as the storage electrode 131. For example, the central part 191 may have shapes such as a circle, an ellipse, a diamond, a square and an octagon. The horizontal part 192 is horizontally formed passing through the central part 191. The pixel region is horizontally divided into halves by the horizontal part 192. The vertical part 193 is vertically formed passing through the central part 191. The pixel region is vertically divided into halves by the vertical part 193. The oblique parts 194 are provided in four sub pixel regions defined by the horizontal and vertical parts 192 and 193, and include a plurality of electrodes spaced apart by a plurality of microslits. A gap between the microslits may be maintained smaller than that between the lower and upper substrates 100 and 200. For example, the gap between the microslits may be 4 micrometers (μm) or smaller.

The oblique part 194 includes a plurality of electrodes which protrude in oblique direction from the central part 191, the horizontal part 192 and the vertical part 193 and spaced apart by the microslits. For example, the plurality of electrodes protrude from both edges of the horizontal part 192, the vertical part 193, and the central part 191 respectively. The edges of the central part 191 are perpendicular to the electrodes protruding therefrom. That is, one oblique part 194 includes the electrodes protruding from the central part 191, the horizontal part 192 and the vertical part 193, respectively. The number of the protruding electrodes of the oblique part 194 may be increased or decreased by adjusting the width of the microslit and the width of the electrode as needed. The protruding electrode of the oblique part 194 may be inclined at approximately 45° with respect to the horizontal and vertical parts 192 and 193. The protruding electrodes extending from both edges of the horizontal and vertical parts 192 and 193 are symmetrical to the microslits. One region of the vertical part 193, e.g., the vertical part 193 extending upwardly, is connected to the drain electrode 172 through the contact hole 184. The pixel region 190 is divided into the four domains and liquid crystal molecules in the four domains are aligned along different directions. Thereby, a wide viewing angle can be insured.

Referring to FIGS. 2 through 4, the upper substrate 200 includes a black matrix 220, a color filter 230 and a common electrode 240. The black matrix 220 is disposed in a region corresponding to a region other than the pixel region over the insulating substrate 200. The red, green and blue color filters 230 are disposed in a region corresponding to the pixel region where the black matrix 220 is not formed. The common electrode 240 is formed of a transparent conductive material.

The black matrix 220 is provided in a predetermined region of the second substrate 210 corresponding to a region other than the pixel region. The black matrix 220 prevents light leakage through the region other than the pixel region, and light interference between adjacent pixel regions. That is, the black matrix may be disposed on a predetermined region of the upper substrate 200 corresponding to the gate line 120, the TFT T and the storage electrode line 130. The black matrix may also be disposed corresponding to a region between a right protruding part and a left protruding part of the data line 170 on the upper substrate 200. Even if the black matrix 220 is provided in the shape of a straight line in a region corresponding to the region between the right protruding part and the left protruding part of the data line 170, the right protruding part and the protruding part can help prevent light leakage. As a result, a decrease in aperture ratio can be prevented.

The color filter 230 is disposed in each pixel region. That is, the red, green and blue color filters 230 are repeatedly arranged in the pixel regions within boundaries defined by the black matrix 220. Each of the color filters 230 displays its own color by light emitted from a light source and transmitting through a liquid crystal layer 300. The color filter 230 may be formed of, for example, photosensitive organic material.

The common electrode 240 is disposed on the black matrix 220 and the color filter 230. The common electrode may be formed of a transparent conductive material such as, for example, ITO and IZO. The common electrode 240 and the pixel electrode 190 of the lower substrate 100 apply a voltage to the liquid crystal layer 300. A cutout is not provided in the common electrode 240.

In addition, a vertical alignment layer may be coated on inner surfaces of the lower and upper substrates 100 and 200, and polarizers may be disposed on outer surfaces of the lower and upper substrates 100 and 200. Transmitting axes of the two polarizers are perpendicular to each other. One of the transmitting axes is parallel with the gate line 120. Further, a retardation film may be provided between the upper and lower substrates 100 and 200 and the polarizer respectively so as to compensate for a delay of the liquid crystal layer 300. The retardation film has a birefringence and inversely compensates for the birefringence of the liquid crystal layer 300. A uniaxial or biaxial optical film, may be used as the retardation film. For example, a negative uniaxial optical film may be used as the retardation film.

Figure 5:
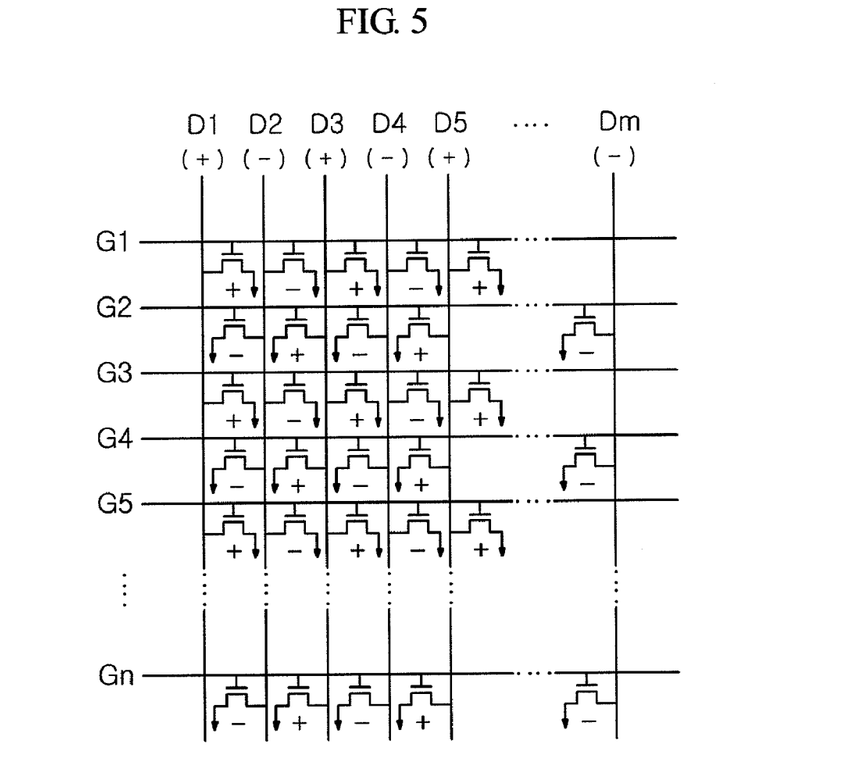
FIG. 5 is a schematic view illustrating connections of thin film transistors (TFTs) in the LCD panel of FIG. 1.

In the LCD panel in accordance with the exemplary embodiment, odd-numbered gate lines G1, G3 . . . , Gn–1 are connected to a plurality of data lines D1 through Dm at the left sides thereof to form TFTs, whereas even-numbered gate lines G2, G4 . . . , Gn are connected to the plurality of data lines D1 through Dm at the right sides thereof to thereby form TFTs, as illustrated in FIG. 5. That is, in a pixel region overlapping odd-numbered gate line G1, G3 . . . or Gn–1 and a data line D1, D2 . . . or Dm, the data line D1, D2 . . . or Dm protrudes to the right side to form a TFT. Likewise, in a pixel region overlapping even-numbered gate line G2, G4 . . . or Gn and a data line D1, D2 . . . or Dm, the data line D1, D2 . . . or Dm protrudes to the left side to form a TFT. Here, when positive and negative polarity data signals are alternately applied through the plurality of data lines D1 through Dm, (+), (−), (+) and (−) polarity data signals are applied to the pixel regions disposed on the right side of the odd numbered data lines. Meanwhile, (−), (+), (−) and (+) polarity data signals are applied to the pixel regions disposed on the right side of the even numbered data lines. In other words, the LCD panel is driven in a dot inversion manner even though the data signals are applied in a vertical inversion manner.

When a common voltage is applied to the common electrode 240 as shown in FIGS. 2 through 4 and a data voltage is applied to the pixel electrode 190, a primary electric field almost perpendicular to a surface of the substrate is generated. The liquid crystal molecules of the liquid crystal layer 300 try to change their alignment directions in response to the primary electric field so that the major axis direction is perpendicular to the primary electric field. At this time, the microslits distort the vertical electric field and generate a horizontal component determining the alignment direction of the liquid crystal molecule. Thus, the alignment direction of the liquid crystal molecule may be controlled by the electric field such that it is inclined at approximately 45° along the direction of the microslit.

Figure 6:
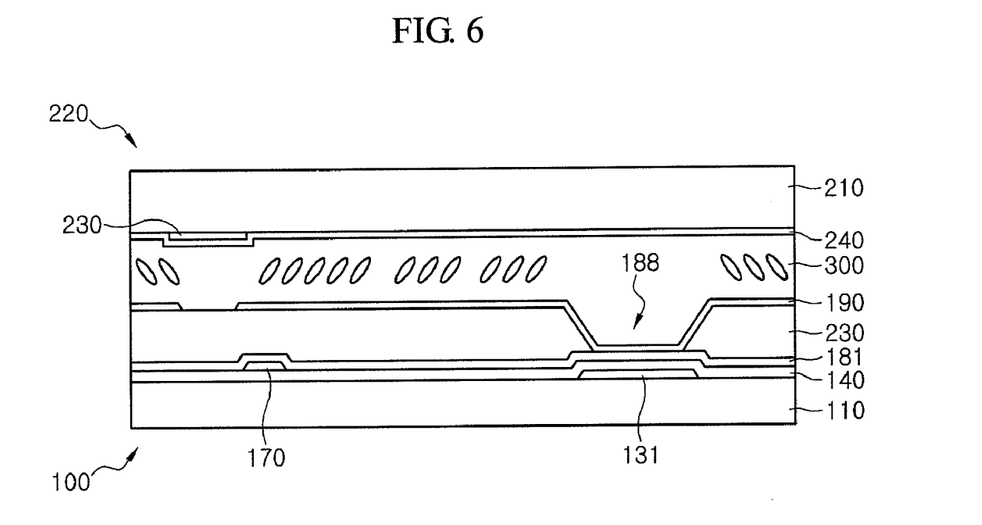
FIG. 6 is a sectional view of a color filter on array (COA) structure in accordance with a modified example of the LCD panel of FIG. 1.

The LCD panel in accordance with the exemplary embodiment may have a COA structure where the color filter 230 is formed on the lower substrate 100 instead of the second insulation layer 182, as illustrated in FIG. 6. In this case, the color filter is not provided on the upper substrate 200.

The LCD panel in accordance with the exemplary embodiment includes first and second sub pixel regions. Different voltages can be applied to the first and second sub pixel regions by charge-sharing even if the same data voltage is applied to the pixel region. The LCD panel using the charge-sharing will be described in detail below.

Figure 7:
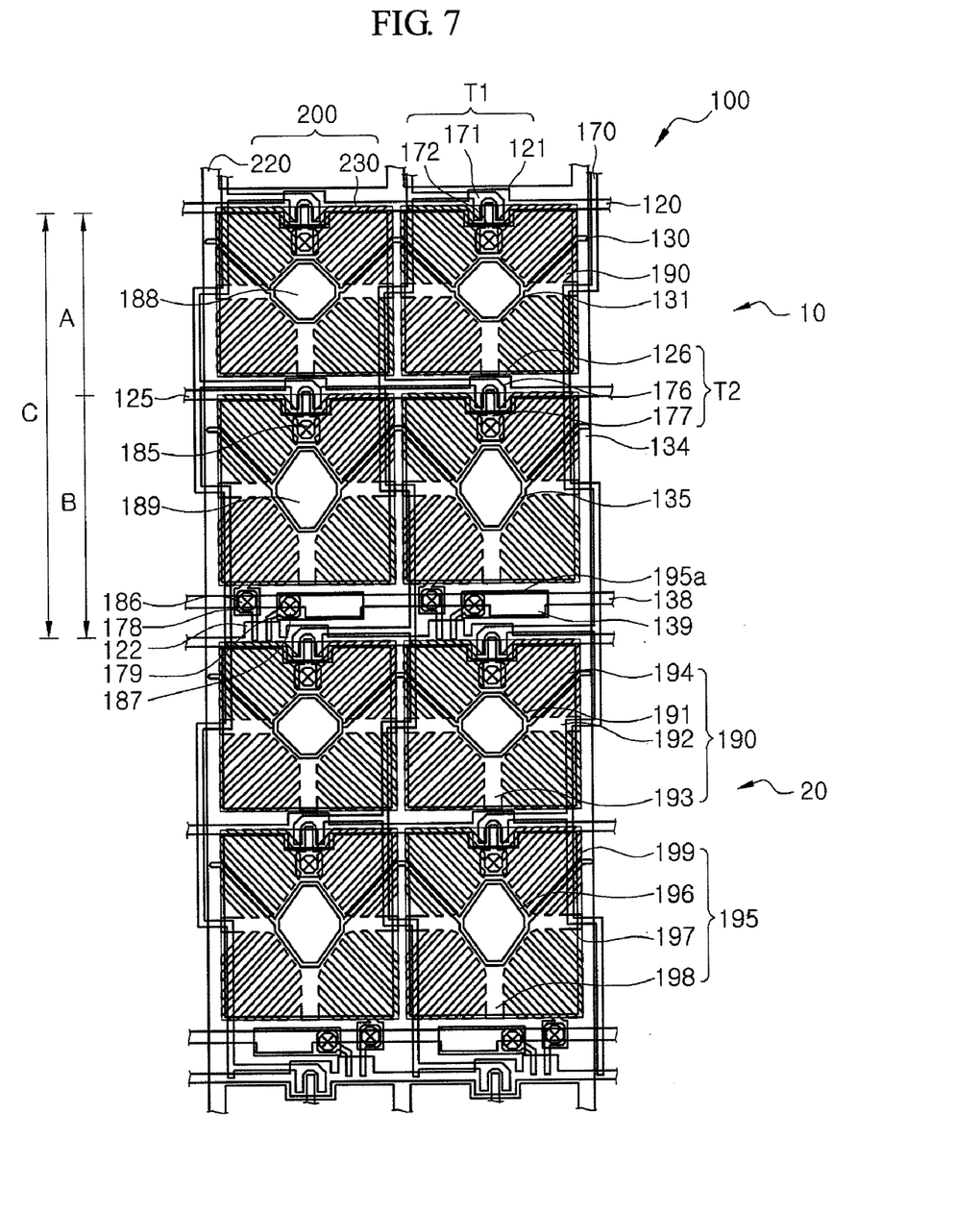
FIG. 7 is a plan view of an LCD panel in accordance with an exemplary embodiment.
Figure 8:
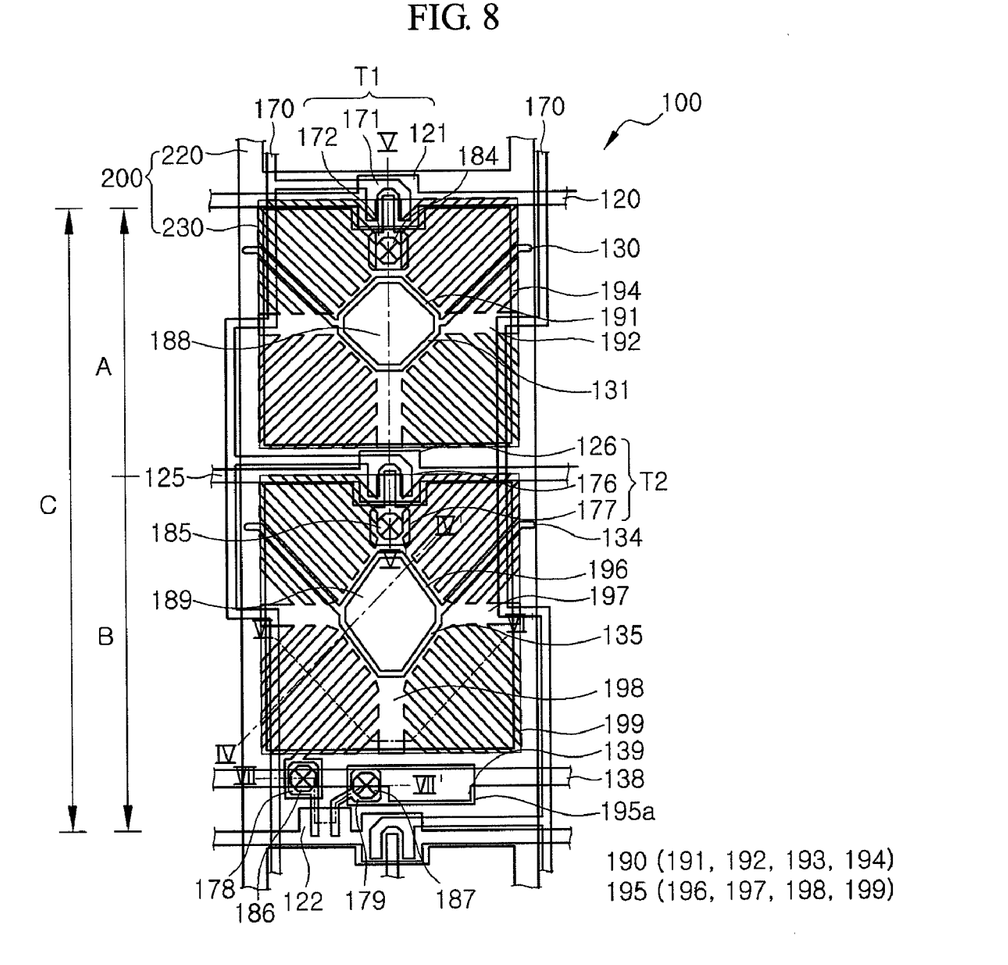
FIG. 8 is a plan view illustrating one pixel region of the LCD panel of FIG. 7.
Figure 9:
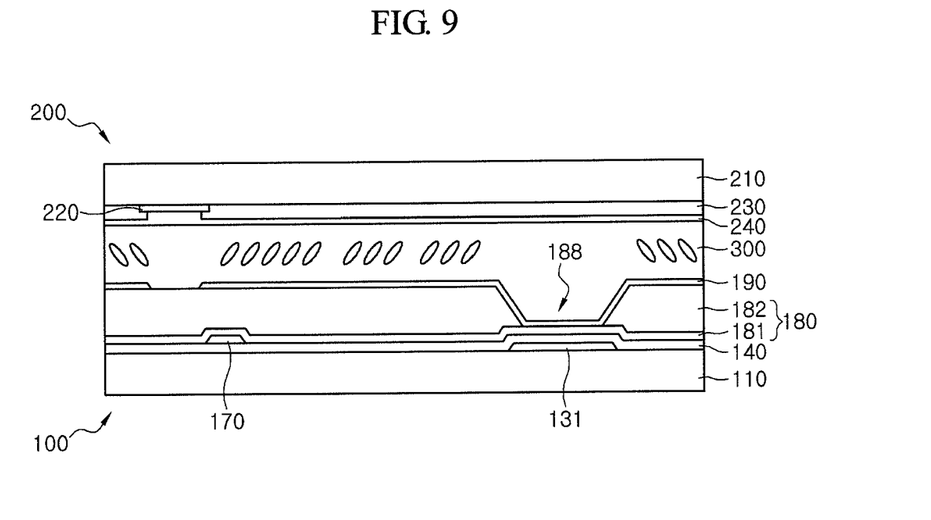
FIG. 9 is a sectional view taken along line IV-IV' of FIG. 8.
Figure 10:
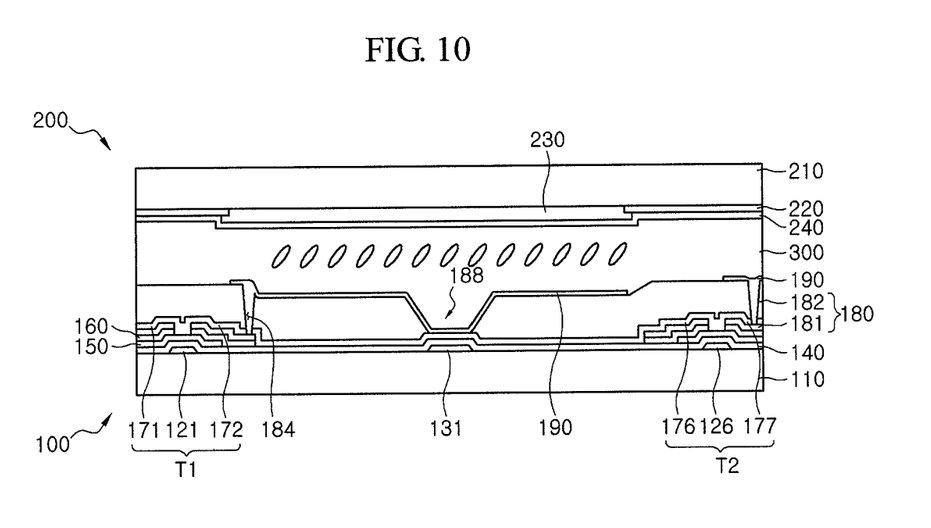
FIG. 10 is a sectional view taken along line V-V' of FIG. 8.
Figure 11:
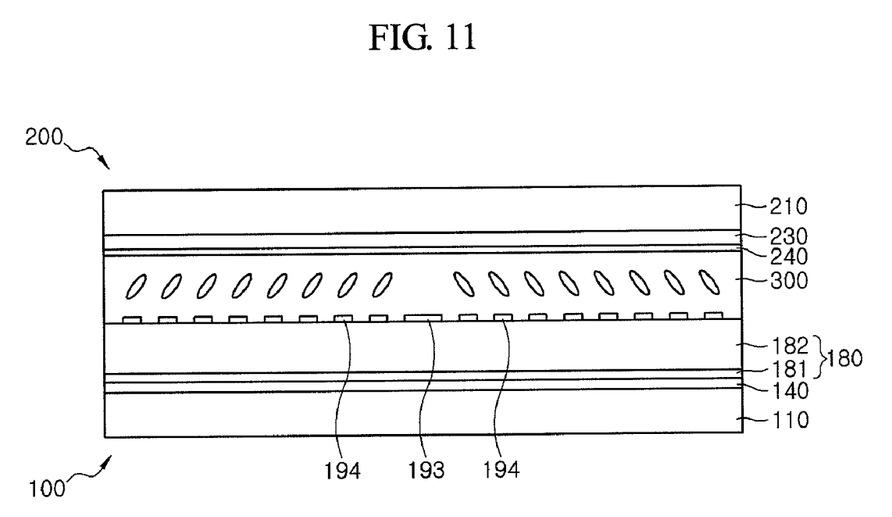
FIG. 11 is a sectional view taken along line VI-VI' of FIG. 8.

FIG. 7 is a plan view of an LCD panel in accordance with another exemplary embodiment, and FIG. 8 is a plan view illustrating one pixel region of the LCD panel with another exemplary embodiment of FIG. 7. FIG. 9 is a sectional view taken along line IV-IV' of FIG. 8, FIG. 10 is a sectional view taken along line V-V' of FIG. 8, and FIG. 11 is a sectional view taken along line VI-VI' of FIG. 8.

Referring to FIGS. 7 through 12, the LCD panel of this exemplary embodiment includes: a lower substrate 100 provided with a first gate line 120, a second gate line 125, a data line 170, a first TFT T1, a second TFT T2 and the like; an upper substrate 200 provided with a common electrode 250 and the like; and a liquid crystal layer 300 interposed between the lower and upper substrates 100 and 200. A pixel region C defined in the lower substrate 100 includes a first sub pixel region A defined by the first gate line 120 and the data line 170, and a second sub pixel region B defined by the second gate line 125 and the data line 170. A higher voltage is applied to the first sub pixel region A compared to the second sub pixel region B. An area of the second sub pixel region B is approximately 1.5 to 2.5 times as large as that of the first sub pixel region A.

As illustrated in FIGS. 7 and 8, a lower substrate 100 includes first and second gate lines 120 and 125, a plurality of data lines, first and second pixel electrodes 190 and 195, and first and second TFTs T1 and T2. The first and second gate lines 120 and 125 extend in a direction over a first insulating substrate 110, and are spaced apart from each other. Further, the first and second gate lines 120 and 125 are supplied with the same gate signal. The plurality of data lines 170 extends in a direction intersecting the first and second gate lines 120 and 125. The first and second pixel electrodes 190 and 195 are provided in the first and second sub pixel regions A and B defined by the first and second gate lines 120 and 125 and the data line 170. The first and second pixel electrodes 190 and 195 include a plurality of electrodes which are spaced apart by microslits. The first TFT T1 is connected to the first gate line 120, the data line 170 and the first pixel electrode 170, and is disposed in a central portion of the first gate line 120 at one side of the first sub pixel region A. The second TFT T2 is connected to the second gate line 125, the data line 170 and the second pixel electrode 195, and is disposed in a central portion of the second gate line 125 at one side of the second sub pixel region B.

The first gate line 120 extends in one direction, for example, a horizontal direction, over the first insulating substrate 110. A portion of the first gate line 120 protrudes to have a greater width than the other portions, thereby forming a first gate electrode 121. The first gate electrode 121 is disposed in the central portion of the first gate line 120 between the two data lines 170. Further, a portion of the first gate line 120 protrudes to form a first electrode pattern 122 which has a smaller width than the first gate electrode 121 and is spaced apart from the first gate electrode by a predetermined distance.

The second gate line 125 is spaced apart from the first gate line 120 over the first insulating substrate, and extends in the same direction as the first gate line 120. A portion of the second gate line 125 protrudes to have a greater width than the other portions, thereby forming a second gate electrode 126. The second gate electrode 125 is disposed in the central portion of the second gate line 120 between the two adjacent data lines 170.

First, second and third storage electrode lines 130, 134 and 138 are disposed to be spaced apart from each other on the same layer as the first and second gate lines 120 and 125. The first storage electrode line 130 has a curved shape and passes through a region between the first gate line 120 and the second gate line 125 in the first such pixel region A. A portion of the first storage electrode line 130 protrudes to have a greater width than the other portions, thereby forming a first storage electrode 131. For example, the first storage electrode line 130 includes a downwardly extending portion, a horizontally extending portion and an upwardly extending portion. For example, the downwardly extending portion downwardly extends from an upper portion of one side of the first sub pixel region A to a central portion of the first sub pixel region A. For instance, the downwardly extending portion may downwardly extend toward the central portion of the first sub pixel region A from a predetermined region between a starting point of a horizontal line, which horizontally divides the first sub pixel region A into halves, and the first gate line 120 disposed above the horizontal line. For example, the predetermined region from which the downwardly extending extends may be a central region between the horizontal line and the first gate line 120. The horizontally extending portion has a predetermined length, and extends from an end of the downwardly extending portion to pass through the central portion of the first sub pixel region A. The first storage electrode 131 is disposed at the horizontally extending portion. The upwardly extending portion extends from an end of the horizontally extending portion to an upper portion of the right side of the first sub pixel region A at a predetermined slope. For instance, the upwardly extending portion may upwardly extend to a predetermined region between an end point of the horizontal line, which horizontally divides the pixel region into halves, and the first gate line 120 disposed above the horizontal line. For example, the predetermined region to which the upwardly extending portion extends may be a central region between the end point of horizontal line and the first gate line 120. Absolute values of slopes of the downwardly extending portion and the upwardly extending portion are substantially identical. The starting point of the downwardly extending portion and the end point of the upwardly extending portion face each other. A slope of the first storage electrode line 130 may be substantially equal to that of an oblique part 194 of the first pixel electrode 190, which will be described later. The first storage electrode line 130 may be designed to overlap microslits of the oblique part 194, so that an aperture ratio is not reduced. The first storage electrode lines 130 are horizontally connected to each other across one pixel region C and another pixel region C adjacent thereto. The first storage electrode 131 with a predetermined width is disposed in the central portion of the pixel region, and may have various shapes such as, for example, a circle, an ellipse, a diamond, a square, an octagon and the like. The first storage electrode 131 overlaps the first pixel electrode 190 to form a storage capacitor. The second storage electrode line 134 is disposed in the second sub pixel region B, and may have the same shape as the first storage electrode line 130. The second storage electrode 135 may have a larger area than the first storage electrode 131 because the second sub pixel region B is defined larger than the first sub pixel region A. The third storage electrode line 138 is disposed between the second gate line 125 of one pixel region C and the first gate line 120 of another pixel region C. For example, the third storage electrode line 138 in one pixel region C is disposed adjacent to the first gate line 120 in another pixel region C. The third storage electrode line 138 may have a shape of, for example, a straight line. Further, a portion of the third storage electrode line 138 protrudes to have a greater width than the other portions, thereby forming a third storage electrode 139.

Herein, the first and second gate lines 120 and 125 and the first, second and third storage electrode lines 130, 134 and 138 may be formed on the same layer through the same process. The first and second gate lines 120 and 125 and the first, second and third storage electrode lines 130, 134 and 138 may be formed of, for example, one of aluminum (Al), Copper (Cu), neodymium (Nd), silver (Ag), chromium (Cr), titanium (Ti), tantalum (Ta), molybdenum (Mo) and combinations thereof, or an alloy including at least one of the foregoing materials. Further, the gate line 120 and the storage electrode line 130 may have, for example, a monolayered structure or a multilayered structure having a plurality of metal layers.

As illustrated in FIGS. 8 through 11, a gate insulation layer 140 is disposed on an entire surface covering the first and second gate lines 120 and 125, and the first, second and third storage electrode lines 130, 134 and 138. The gate insulation layer 140 may have, for example, a monolayered structure or a multilayered structure formed of silicon oxide ($SiO_2$) or silicon nitride ($SiN_x$).

As illustrated in FIG. 10, an active layer 150 formed of a first conductive material such as, for example, amorphous silicon is disposed on the first and second gate electrodes 121 and 126 and the gate insulation layer 140 provided over the first electrode pattern 122. An ohmic contact layer 160 is disposed on the active layer 150. Here, the ohmic contact layer 160 is formed of a second conductive material such as, for example, n+ hydrogenated amorphous silicon where n-type impurities are heavily doped.

As illustrated in FIGS. 7 and 8, the data line 170 extends in a direction intersecting the first and second gate lines 120 and 125, for example, in a vertical direction, and may have protruding patterns which are periodically arranged. For instance, the data line 170 is configured so that right protruding portions and left protruding portions are alternately arranged with respect to a vertical boundary of the first and second sub pixel regions A and B which are adjacent to each other. For example, the data line 170 protrudes to the left from a central region of the first sub pixel region A to a central region of the second sub pixel region B which is disposed right below the first sub pixel region A. The data line 170 protrudes to the right from the central region of the first sub pixel region A to the central region of the second sub pixel region B which is disposed right above the first sub pixel region A. As such, two data lines 170 are arranged along left and right sides of the pixel region C. The left data line 170 overlaps an upper portion of the first sub pixel region A and a lower portion of the second sub pixel region B. The right data line 170 overlaps a lower portion of the first sub pixel region A and an upper portion of the second sub pixel region B. Therefore, overlapping portions of the first and second sub pixel regions A and B with the data line 170 are diagonally arranged with respect to the center of each of the first and second sub pixel regions A and B. An aperture ratio can be improved because the data line 170 overlaps the first and second sub pixel regions A and B. Consequently, a voltage drop caused by capacitances of the first and second pixel electrodes 190 and 195 and the data line 170 offsets a voltage rise caused by capacitances of the first and second pixel electrodes 190 and 195 and the data line 170 during frame operation. Thereby, a pixel voltage variation can be minimized. The data line 170 is branched into a first source electrode 171 extending to the first gate electrode 121, and a first drain electrode 172 separated from the first source electrode 171. Likewise, the data line 170 is branched into a second source electrode 176 extending to the second gate electrode 126, and a second drain electrode 177 separated from the second source electrode 176. Second and third electrode patterns 178 and 179 are branched from the data line 170. The second electrode pattern 178 extends to the first electrode pattern 122 of the first gate line 120 adjacent thereto in a predetermined region over the third storage electrode line 138. The third electrode pattern 179 is spaced apart from the second electrode pattern 179, and extends to the first electrode pattern 122 in a predetermined region over the third storage electrode line 138. Therefore, the first electrode pattern 122 acts as a switching component together with the second and third electrode patterns 178 and 179, and thus acts as a voltage regulator regulating a voltage applied to the second pixel electrode 195 due to charges accumulated in the third storage electrode 139. As illustrated in FIGS. 7 and 8, the first and second source electrodes 171 and 175 are branched from another data line 170 depending on a position of the pixel electrode. For example, the first and second source electrodes 171 and 176 are branched from the left one of the two data lines 170 in the pixel region C of an odd-numbered row, whereas the first and second source electrodes 171 and 176 are branched from the right one of the two data lines 170 in the pixel region C of an even-numbered row. Alternatively, the first and second source electrodes 171 and 176 may be branched from the left one of the two data lines 170 in the pixel region C of the even-numbered row, and the first and second source electrodes 171 and 176 may be branched from the right one of the two data lines 170 in the pixel region C of the odd-numbered row. Consequently, the LCD panel is driven in a dot inversion manner even though a data signal is applied in a vertical inversion manner.

As illustrated in FIGS. 7, 8, 10 and 12, the first TFT T1 includes the first gate electrode 121, the first source electrode 171 and the first drain electrode 172. And a channel of the first TFT T1 is formed between the first source electrode 171 and the first drain electrode 172. Likewise, the second TFT T2 includes the second gate electrode 126, the second source electrode 176 and the second drain electrode 177. And a channel of the second TFT T2 is formed between the second source electrode 176 and the second drain electrode 177. The first, second and third electrode patterns 122, 178 and 179 act as switching components. The first and second TFTs T1 and T2 are respectively positioned in a central region of one side of each of the first and second sub pixel regions A and B. The TFTs are thus disposed substantially at equivalent positions in the respective pixels in each row and column. Therefore, aperture ratios of the pixels in each row and column are maintained to be the same or at least substantially the same, and thereby two horizontal lines caused by a difference in aperture ratio can be prevented. The first, second and third electrode patterns 122, 178 and 179 act as a gate electrode, a source electrode and a drain electrode, respectively. A voltage applied to the second pixel electrode 195 drops by a potential due to charges accumulated in the third storage electrode 130 acting as a power supply.

The data line 170, the first and second source electrodes 171 and 176, and the first and second drain electrodes 172 and 177 may be formed of a conductive material used as the first and second gate lines 120 and 125.

A passivation layer 180 is disposed on the data line 170, the first drain electrode 172, and the second drain electrode 177. The passivation layer 180 may include, for example, a thin first insulation layer 181 and a thick second insulation layer 182. Alternatively, a color filter may be provided instead of the second insulation layer 182 so that the LCD panel can have a COA structure or an SCOA structure.

As illustrated in FIGS. 9 and 10, first and second contact hole 184 and 185, third and fourth contact holes 186 and 187, and first and second openings 188 and 189 are provided in the passivation layer 180. The first and second contact hole 184 and 185 expose predetermined regions of the first and second drain electrodes 172 and 177. The third and fourth contact holes 186 and 187 expose predetermined regions of the second and third electrode patterns 178 and 179. The first and second openings 188 and 189 expose top surfaces of the first and second storage electrodes 131 and 135. The contact holes 184 through 187 are formed by partially removing the first and second insulation layers 181 and 182. The openings 188 and 189 are formed by keeping the first insulation layer 181 and then removing the second insulation layer 182.

As illustrated in FIGS. 7 through 10, the first and second pixel electrodes 190 and 195 formed of ITO or IZO are disposed on the passivation layer 180 over the first and second sub pixel regions A and B. The first pixel electrode 190 is connected to the first drain electrode 172 through the first contact hole 184. The second pixel electrode 195 is connected to the second drain electrode 177 through the second contact hole 185, and also connected to the second electrode pattern 178 through the third contact hole 186. A conductive material 195a separated from the pixel electrode when forming the first and second pixel electrodes 190 and 195 is connected to the third electrode pattern 179 through the fourth contact hole 187. The first and second pixel electrodes 190 and 195 respectively overlap the first and second storage electrodes 131 and 135 through the first and second openings 188 and 189 while the gate insulation layer 140 and the first insulation layer 181 are interposed therebetween, thus forming first and second storage capacitors. The storage capacitances of the first and second storage capacitors can be controlled by, for example, adjusting overlapping areas between the first and second storage electrodes 131 and 135 and the first and second pixel electrodes 190 and 195.

As illustrated in FIGS. 7, 8 and 11, the first pixel electrode 190 includes a central part 191, a horizontal part 192, a vertical part 193 and a plurality of oblique parts 194. Likewise, the second pixel electrode 195 includes a central part 196, a horizontal part 197, a vertical part 198 and a plurality of oblique parts 199. The central parts 191 and 196 are respectively provided in central regions of the first and second sub pixel regions A and B The central parts 191 and 196 may have the same shape as the first and second storage electrodes 131 and 135. For example the central parts 191 and 196 may have shapes such as a circle, an ellipse, a diamond, a square, octagon and the like. The horizontal parts 192 and 197 pass through the central parts 191 and 196, and are horizontally formed. The first and second sub pixel regions A and B are horizontally divided into halves respectively by the horizontal parts 192 and 197. The vertical parts 193 and 198 pass through the central parts 191 and 196, and are vertically formed so that the first and second sub pixel regions A and B are vertically divided into halves respectively. The oblique parts 194 and 199 are respectively provided in the first and second sub pixel regions A and B which are divided into four sub pixel regions by the horizontal parts 192 and 197 and vertical parts 193 and 198. The oblique parts 194 and 199 include a plurality of electrodes spaced apart by a plurality of microslits. A gap between the microslits may be maintained smaller than a space between the lower and upper substrates 100 and 200. For example, the gap between the microslits may be about 4 μm or smaller.

As illustrated in FIGS. 7 and 8, the oblique parts 194 and 199 includes the plurality of electrodes which protrude in oblique direction from the central parts 191 and 196, the horizontal parts 192 and 197 and the vertical parts 193 and 198 and spaced apart by the microslit. The number of the protruding electrodes in the oblique parts 194 and 199 may be increased or decreased by adjusting the width of the microslit and the width of the electrode. Edges of each central part 191 and 196 are perpendicular to the electrodes protruding therefrom. The protruding electrode of the oblique part 194 may be inclined at approximately 45° with respect to the horizontal parts 192 and 197 and the vertical parts 193 and 198. The microslits extending from both edges of the horizontal parts 192 and 197 and the vertical parts 193 and 198 are symmetrical to each other. Regions of the vertical parts 193 and 198, e.g., the vertical parts 193 and 198 extending upwardly, are respectively connected to the first and second drain electrodes 172 and 177 through the first and second contact holes 184 and 185.

As illustrated in FIGS. 9 through 11, the upper substrate 200 includes a black matrix 220, a color filter 230 and a common electrode 240. The black matrix 220 is disposed in a region corresponding to a region except the pixel region over the insulating substrate 200. The color filter 230 of red, green or blue is disposed in a region corresponding to the pixel region where the black matrix 220 is not formed. The common electrode 240 is formed of a transparent conductive material.

The black matrix 220 is provided in a predetermined region except the first and second sub pixel regions A and B. For instance, the black matrix 220 may be disposed on the upper substrate 200 in a region corresponding to the first and second gate lines 120 and 125, the first and second TFTs T1 and T2, and the first, second and third storage electrode lines 130, 134 and 138. The black matrix 220 may also be disposed on the upper substrate 200 in a region corresponding to a region between the right protruding part and the left protruding part of the data line 170. The right protruding part and the left protruding part of the data line 170 can help prevent the light leakage. For this reason, even if the black matrix 220 is provided in the shape of a straight line in a region corresponding to a region between the right protruding part and the left protruding part of the data line 170, a decrease in aperture ratio can be prevented.

As illustrated in FIGS. 9 and 10, the color filter 230 is disposed in each pixel region C. That is, the red, green and blue color filters 230 are repeatedly arranged in the pixel regions within boundaries defined by the black matrix 220. The same color filter 230 is provided in the first and second sub pixel regions A and B of the pixel region C. Each of the color filters 230 realizes its own color by transmitting corresponding wavelength-band light which is incident from a light source. The color filter 230 may be formed of, for example, photosensitive organic material.

As illustrated in FIGS. 9 through 11, the common electrode 240 is disposed on the black matrix 220 and the color filter 230. The common electrode may be formed of a transparent conductive material such as, for example, ITO and IZO. The common electrode 240 applies a voltage to the liquid crystal layer 300 together with the first and second pixel electrodes 190 and 195 of the lower substrate 100. A cutout is not provided in the common electrode 240. Alternatively, patterns may be provided in the common electrode 240 if necessary.

Figure 13:
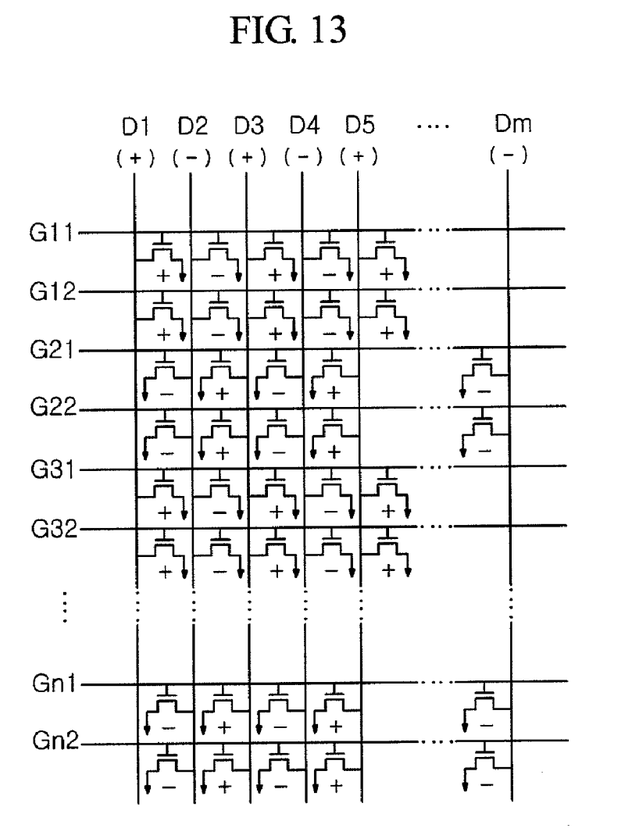
FIG. 13 is a schematic view illustrating connections of TFTs in the LCD panel of FIG. 7.

In the LCD panel in accordance with this exemplary embodiment, odd-numbered first and second gate lines G11, G12, G31, G32, . . . , Gn–11, Gn–12 are connected to a plurality of data lines D1 through Dm at left sides thereof to thereby form TFTs, whereas even-numbered first and second gate lines G21, G22, G41, G42, . . . , Gn1, Gn2 are connected to the plurality of data lines D1 through Dm at right sides thereof to thereby form TFTs, as illustrated in FIG. 13. That is, in pixel regions overlapping odd-numbered first and second gate lines G11, G12, G31, G32, . . . or Gn–11, Gn–12 and a data line D1, D2 . . . or Dm, the data line D1, D2 . . . or Dm protrudes to the right side to form TFTs. Likewise, in pixel regions overlapping even-numbered first and second gate lines G21, G22, G41, G42, . . . or Gn1, Gn2 and a data line D1, D2 . . . or Dm, the data line D1, D2 . . . or Dm protrudes to the left side to form TFTs. Here, when positive and negative polarity data signals are alternately applied through the plurality of data lines D1 through Dm, (+), (−), (+) and (−) polarity data signals are applied to the pixel regions disposed on the right side of the odd-numbered first and second gate lines G11, G12, G31, G32, . . . , Gn–11, Gn–12. Meanwhile, (−), (+), (−) and (+) polarity data signals are applied to the pixel regions disposed on the right side of the even-numbered first and second gate lines G21, G22, G41, G42, . . . , Gn1, Gn2. That is, the LCD panel is driven in a dot inversion manner even though the data signals are applied in a vertical inversion manner.

Figure 12:
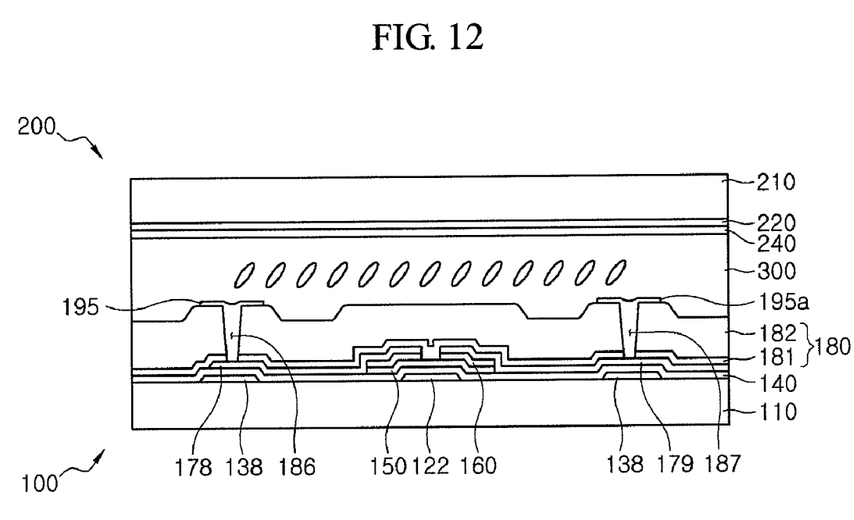
FIG. 12 is a sectional view taken along line VII-VII' of FIG. 8.

As illustrated in FIG. 12, the first, second and third electrode patterns 122, 178 and 179 acting as switching components drop the voltage applied to the second pixel electrode 195 due to charges accumulated in the third storage electrode 139 acting as a power supply. Therefore, a higher voltage is applied to the first pixel electrode 190 than the second pixel electrode 195 even if the same voltage is applied to the first and second pixel electrodes 190 and 195.

When a common voltage is applied to the common electrode 240 of the LCD panel as illustrated in FIGS. 7 through 11 and a data voltage is applied to the first and second pixel electrodes 190 and 195, a primary electric field almost perpendicular to a surface of the LCD panel is generated. The liquid crystal molecules of the liquid crystal layer 300 try to change their alignment directions in response to the primary electric field so that the major axis direction is perpendicular to the direction of the primary electric field. At this time, the microslits distort the vertical electric field and generate a horizontal component determining the alignment direction of the liquid crystal molecule. Thus, the alignment direction of the liquid crystal molecule may be controlled by the electric filed such that it is inclined at approximately 45° along a cutout direction of the microslit.

Figure 14:
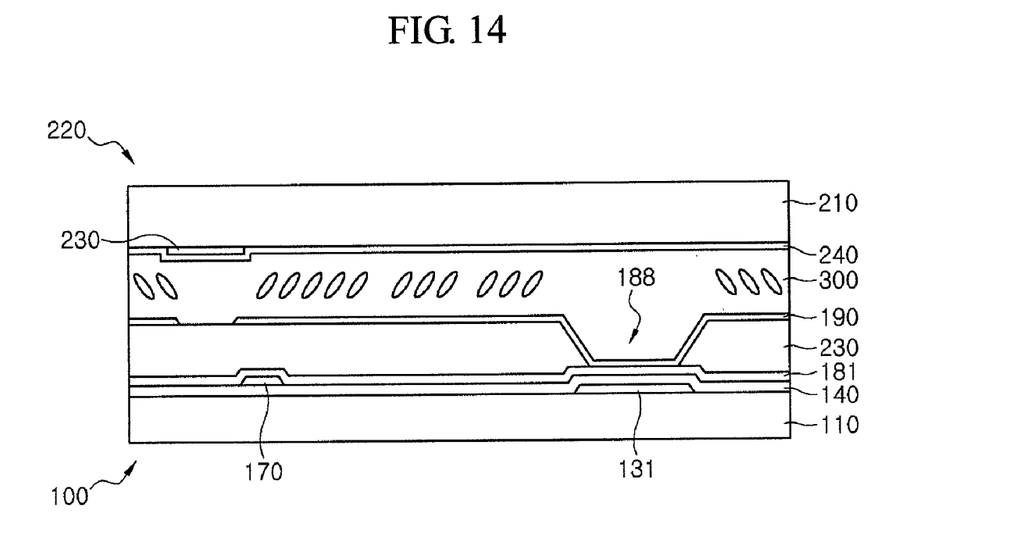
FIG. 14 is a sectional view of a COA structure in accordance with a modified example of the LCD panel of FIG. 7.

The LCD panel in accordance with this exemplary embodiment may have a COA structure where the color filter 230 is disposed on the lower substrate 100 instead of the second insulation layer 182, as illustrated in FIG. 14. In this case, the color filter is not provided on the upper substrate 200.

Figure 15:
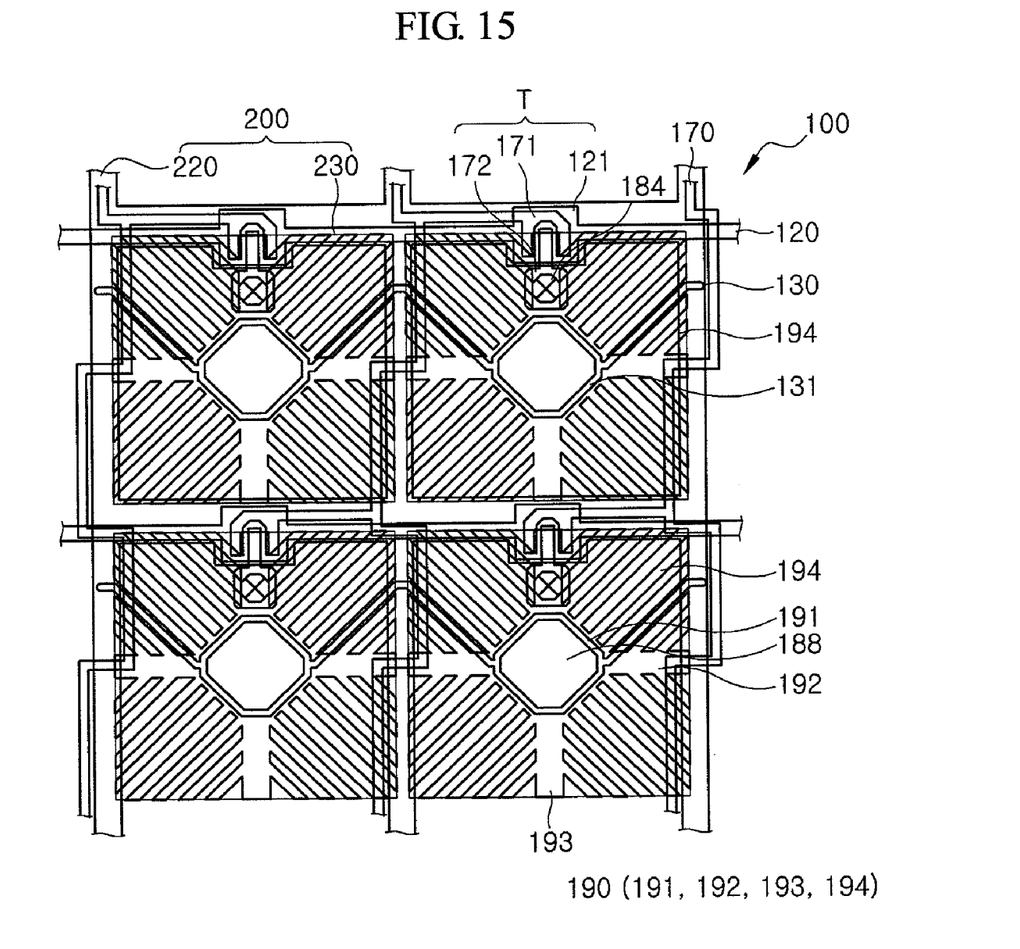
FIG. 15 is a plan view of an LCD panel in accordance with a modified exemplary embodiment.

In the exemplary embodiments, it is illustrated that the data line has a plurality of protruding patterns which are repeated across every two pixel regions or sub pixel regions. The present invention, however, is not limited to the above exemplary embodiments, and hence the data line may have a plurality of protruding patterns which are repeated across every one pixel region or sub pixel region, as illustrated in a schematic plan view of FIG. 15. In this case, the data line may overlap the pixel regions such that the overlapping regions are diagonally arranged with respect to the center of the pixel region or the sub pixel region. Therefore, as a result, the aperture ratio may be improved and a variation of the pixel voltage may be further minimized.

Figure 16:
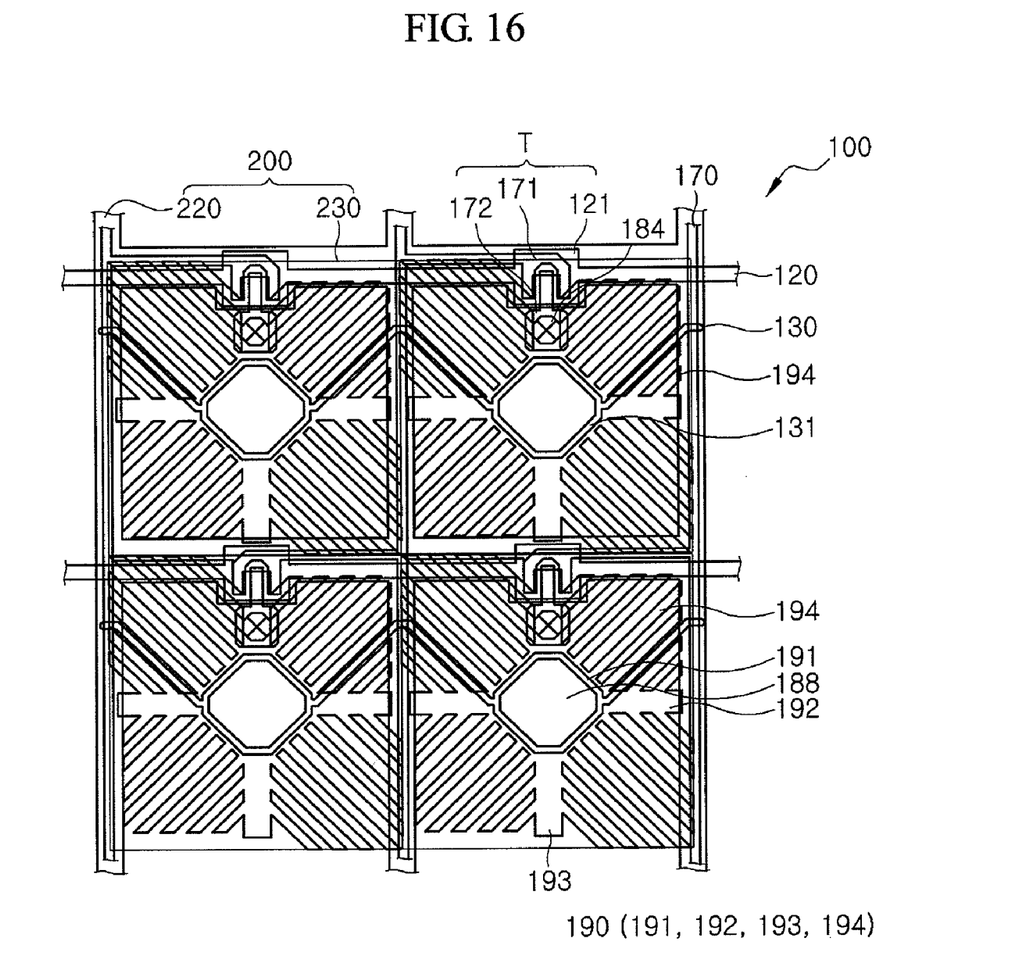
FIG. 16 is a plan view of an LCD panel in accordance with a modified exemplary embodiment.

Alternatively, even if the data line does not have a protruding pattern but has the shape of a straight line, it is possible to overlap the data line and the pixel electrode by changing the shape of the pixel electrode. That is, as illustrated in a schematic plan view of FIG. 16, the data line has the shape of a straight line and one region and another region of the pixel electrode, which are diagonally arranged with respect to the center of the pixel electrode, can overlap the data line.

In addition to the above-described embodiment, various methods may be employed. For example, a method may be employed in which the storage electrode is disposed in a central portion of the pixel region and the data line and the pixel electrode partially overlap each other.

As described above, in accordance with the exemplary embodiments, a pixel electrode can overlap a data line by forming a thick low-dielectric-constant passivation layer over the data line, and thereby an aperture ratio can be improved. Further, as the pixel region partially overlaps two adjacent data lines, respectively, a voltage drop caused by capacitances of the pixel electrode and one data line to which a data signal is applied offsets a voltage rise caused by capacitances of the pixel electrode and another data line in a next frame operation, and thus as result a pixel voltage variation can also be minimized.

A storage electrode is formed in a central portion of the pixel region where a microslit is not formed, and a thick low-dielectric-constant insulation layer at the central portion is then removed to form storage capacitance between the pixel electrode and the storage electrode, so that the storage capacitance can be sufficiently increased.

In addition, TFTs in pixel regions in subsequent rows are alternately connected to two adjacent data lines. That is, a TFT in a row is connected to one of the two adjacent data lines and a next TFT in a next row is connected to the adjacent data line. Therefore, an LCD panel is driven in a dot inversion driving manner even though a data signal is applied in a vertical inversion driving manner. This prevents vertical crosstalk, thereby resulting in improved display quality.

Moreover, a TFT is formed in a central region between two data lines overlapping a gate line, and TFTs are disposed at equivalent positions in the respective pixel regions. Therefore, aperture ratios of pixels in each row can be maintained substantially the same, and thereby two horizontal lines caused by a difference in aperture ratio can be prevented. Accordingly, display quality can be improved.

Having described the exemplary embodiments of the present invention, it is further noted that it is readily apparent to those of reasonable skill in the art that various modifications may be made without departing from the spirit and scope of the present invention which is defined by the metes and bounds of the appended claims.

What is claimed is:

1. A thin film transistor (TFT) substrate, comprising:
   a plurality of gate lines extending in one direction;
   a plurality of data lines extending in a direction intersecting the gate lines;
   a pixel electrode formed in a pixel region defined by an intersection of the gate line and the data line, one side of the pixel electrode overlapping a portion of one data line and another side of the pixel electrode overlapping a portion of another data line; and
   a storage electrode line having a storage electrode disposed in a central portion of the pixel region,
   wherein the pixel electrode comprises: a horizontal part passing through a central region between the gate lines; a vertical part passing through a central region between the data lines; a central art defined in an intersecting region of the vertical part and the horizontal part in the central portion of the pixel region; and an oblique part formed from the vertical part, the horizontal part and the central part in an oblique direction, and having a plurality of protruding electrodes spaced apart by a plurality of microslits.

2. The TFT substrate of claim 1, wherein the data line has a predetermined protruding pattern.

3. The TFT substrate of claim 2, wherein the protruding pattern periodically protrudes to the left and the right across every one or two pixel regions.

4. The TFT substrate of claim 1, wherein the protruding electrode extending from the central part is perpendicular to one edge of the central part.

5. The TFT substrate of claim 1, wherein one region of the pixel electrode partially overlapping the one data line and another region of the pixel electrode partially overlapping the another data line are diagonally arranged with respect to the central portion of the pixel region.

6. The TFT substrate of claim 1, wherein the storage electrode line comprises a region that upwardly extends in an oblique direction with respect to the storage electrode.

7. The TFT substrate of claim 6, wherein the storage electrode line comprises a region that extends in the same direction as a microslit.

8. The TFT substrate of claim 1, further comprising a TFT connected to the gate line, the data line and the pixel electrode.

9. The TFT substrate of claim 8, wherein the TFT is disposed in a central region between the data lines.

10. The TFT substrate of claim 8, wherein the TFT is connected to the one data line in the pixel region of an odd-numbered row, and connected to another data line adjacent to the one data line in the pixel region of an even-numbered row.

11. The TFT substrate of claim 1, further comprising:
    a gate insulation layer disposed between the gate line and the data line; and
    a passivation layer disposed between the data line and the pixel electrode, the passivation layer having a multilayered structure of a first insulation layer and a second insulation layer.

12. The TFT substrate of claim 1, wherein the passivation layer comprises: a gate insulation layer disposed between the gate line and the data line; a passivation layer disposed between the data line and the pixel electrode; and a color filter disposed on the passivation layer.

13. The TFT substrate of claim 11, wherein the storage electrode overlaps a portion of the pixel electrode with the gate insulation layer and the first insulation layer interposed therebetween.

14. A thin film transistor (TFT) substrate, comprising:
    a plurality of first gate lines and a plurality of second gate lines extending in one direction, and spaced apart from each other;
    a plurality of data lines extending in another direction intersecting the first gate lines and the second gate lines;
    a first pixel electrode and a second pixel electrode provided in a pixel region including a first sub pixel region and a second sub pixel region defined by intersections of the first gate lines and the second gate lines with the data line, a predetermined region at one side of the pixel electrode partially overlapping one data line and a predetermined region at another side of the pixel electrode partially overlapping another data line; and
    a first storage electrode line and second storage electrode line spaced apart from each other, and having a first storage electrode and a second storage electrode in central portions of the first sub pixel region and the second sub pixel region,
    wherein at least one of the first pixel electrode and the second pixel electrode comprises: a horizontal part passing through a central region between the gate lines; a vertical part passing through a central region between the data lines; a central part defined in an intersecting region of the vertical part and the horizontal part in the central portion of the pixel region; and an oblique part formed from the vertical part, the horizontal part and the central part in an oblique direction, and having a plurality of protruding electrodes spaced apart by a plurality of microslits.

15. The TFT substrate of claim 14, wherein the data line has a redetermined protruding pattern.

* * * * *